United States Patent [19]

Ciak

[11] 3,984,823

[45] Oct. 5, 1976

[54] MAGNETIC BUBBLE FIELD-ACCESS REPLICATOR OPERATIVE WITH THE DRIVE FIELD IN A FIXED ORIENTATION

[75] Inventor: Frank John Ciak, Newark, N.J.

[73] Assignee: Bell Telephone Laboratories, Incorporated, Murray Hill, N.J.

[22] Filed: Mar. 21, 1975

[21] Appl. No.: 560,694

[52] U.S. Cl. .......................................... 340/174 TF
[51] Int. Cl.² ....................................... G11C 11/14
[58] Field of Search ................ 340/174 TF, 174 SR

[56] References Cited
UNITED STATES PATENTS

| | | |
|---|---|---|
| 3,810,133 | 5/1974 | Bobeck et al. ................ 340/174 TF |
| 3,876,994 | 4/1975 | Calhoun et al. ............... 340/174 TF |
| 3,879,585 | 4/1975 | Bobeck et al. ................ 340/174 TF |

Primary Examiner—James W. Moffitt
Attorney, Agent, or Firm—H. M. Shapiro

[57] ABSTRACT

A field-access bubble replicator operative in the presence of a magnetic field in a fixed orientation in the bubble film is achieved. Bubble stretch and cut pulses are operative to cut and transfer an image of data in the replicator in the presence of the fixed-orientation field. Phasing limitations characteristic of prior art, field-access bubble replicators are eliminated.

5 Claims, 4 Drawing Figures ately to the degradation of the signal and necessitating increased sophistication in the detection circuitry. To an extent, this "high noise" condition is alleviated
MAGNETIC BUBBLE FIELD-ACCESS REPLICATOR OPERATIVE WITH THE DRIVE FIELD IN A FIXED ORIENTATION

FIELD OF THE INVENTION

This invention relates to magnetic single wall domain arrangements, the most common ones of which are referred to as magnetic bubble memories.

BACKGROUND OF THE INVENTION

The most familiar organization for bubble memory operation employs a pattern of magnetically soft or high permeability elements, typically permalloy, formed on the (coated) surface of an epitaxial film in which bubble movement occurs. The elements respond to a magnetic drive field reorienting in the plane of the film to generate a changing magnetic pole pattern operative to move bubbles in the film in what is commonly called a "field-access" mode of operation.

Typically, the elements are formed in a pattern which defines a parallel arrangement of closed loops in which successive bubble patterns are recirculated in parallel, successive patterns of bubbles moving into information "exchange positions" as the drive field reorients. The elements also define an accessing channel which comes into close proximity with the recirculating loops. Each stage of the accessing channel is associated with a recirculating loop at an exchange position for selectively affecting an exchange of information therebetween. Information exchange is controlled by an electrical conductor which couples the exchange positions serially. When pulsed, the conductor produces a transfer or replication of information depending on the pattern of elements at each exchange position.

The type of organization just described is called a "major-minor" organization and is disclosed in U.S. Pat. No. 3,618,054 of P. I. Bonyhard, U. F. Gianola, and A. J. Perneski issued Nov. 2, 1971. The recirculating loops are called minor loops and function as permanent stores. The accessing channel is called the major channel and serves to move data from a selected address to read and write ports in the major channel.

U.S. Pat. No. 3,810,133 of A. H. Bobeck and I. Danylchuk issued May 7, 1974 discloses a pattern of elements and a conductor geometry which operate, in exchange positions between minor loops and a major channel, to replicate information. The replicator is operative in response to a sequence of a bubble stretching pulse and a bubble cutting pulse to produce an image of data advanced to the exchange positions either from the minor loops or the major channel. It is characteristic of such a replicator that the sequence of pulses occurs as the drive field reorients, the pulses occurring 180° apart with respect to a drive field cycle. Consequently, the phase relationship between the stretch and cut pulses is a constraint on the operation of the memory and results in limitations in the margins of operation for the memory.

There are other limitations to the operation of bubble memories similarly related to the replicator. For example, when the presence of a bubble is detected by a magnetoresistive element, noise due to the replicate pulses, as well as to the drive field necessary for a replication operation, generate noise in the output signal resulting in the degradation of the signal and necessitating increased sophistication in the detection circuitry. To an extent, this "high noise" condition is alleviated by replicating and detecting on alternative cycles of the drive field, a procedure not inconsistent with the fact that the physical space occupied by the elements which define the minor loops dictates that exchange positions in practice be associated with alternative stages of the major channel. Thus, adjacent bits occupy alternate stages of the accessing channel during operation.

A considerable improvement as far as phasing constraints and signal-to-noise ratio, would be achieved if a static replicator existed. That is to say, a pattern of elements and an electrical conductor geometry operative in conjunction with that pattern to produce an image of data (i.e., in minor loops) and to transfer that data to a second (i.e., major) channel while the drive field is in a fixed orientation, would allow relaxed phasing tolerances, improved signal-to-noise ratio, and less expensive detection circuitry.

BRIEF DESCRIPTION OF THE INVENTION

The invention is based on the discovery that replicators of the type disclosed in the above-mentioned Bobeck et al patent are operative to replicate data in response to a sequence of a stretching and a cutting pulse applied while the drive field is in a fixed orientation. An important feature of this invention thus is apparatus for applying to a replicate conductor a sequence of a stretching and a cutting pulse in the presence of a drive field oriented in a first direction in the plane of bubble movement.

DETAILED DESCRIPTION

The major-minor bubble memory organization and its operation as well as the position and function of a replicator in such a memory are fully disclosed in the above-mentioned patents. Consequently, attention is directed herein primarily to the pattern of permalloy elements and conductors which define a replicate function in an illustrative exchange position of such a memory.

Figure 1:
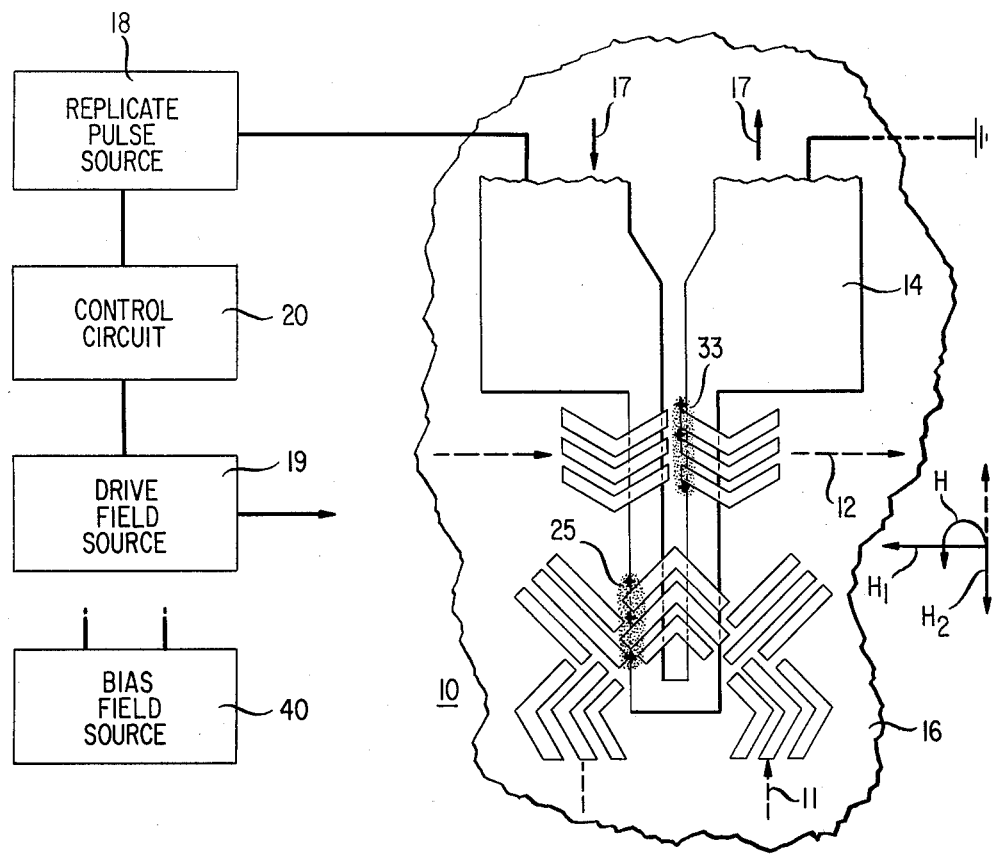
FIGS. 1–4 are schematic representations of a bubble replicator in accordance with this invention showing magnetic bubbles therein during operation.

FIG. 1 shows a portion of a magnetic bubble memory related to an illustrative exchange position 10. The exchange position is defined between a minor loop 11 and a major channel 12. The permalloy elements are shown as chevrons in the illustrative embodiment but can be implemented by differently shaped elements, such as asymmetric disc-shaped elements. Bubbles are assumed to be moving counterclockwise in loop 11 and from left to right in channel 12 as indicated by the broken arrows in the figure. A replicate conductor 14 is formed illustratively in a plane between the plane of the permalloy pattern and a plane 16 of bubble movement. We will adopt the convention that a bubble has its magnetization directed upward out of the plane of the figure towards the viewer and represented by plus signs in the figure. The polarity of the current pulses in conductor 14 is as indicated by arrows 17. The replicate conductor (14) is connected between a replicate pulse source 18 and ground as shown. Bubble movement in plane 16 is accomplished in a well-understood manner in response to a magnetic field represented by curved arrow H and supplied by drive field source represented by block 19. Sources 18 and 19 operate under the control of control circuit 20. Sources 18 and 19 and circuit 20 may be any such elements capable of operating in accordance with this invention.

Figure 2:
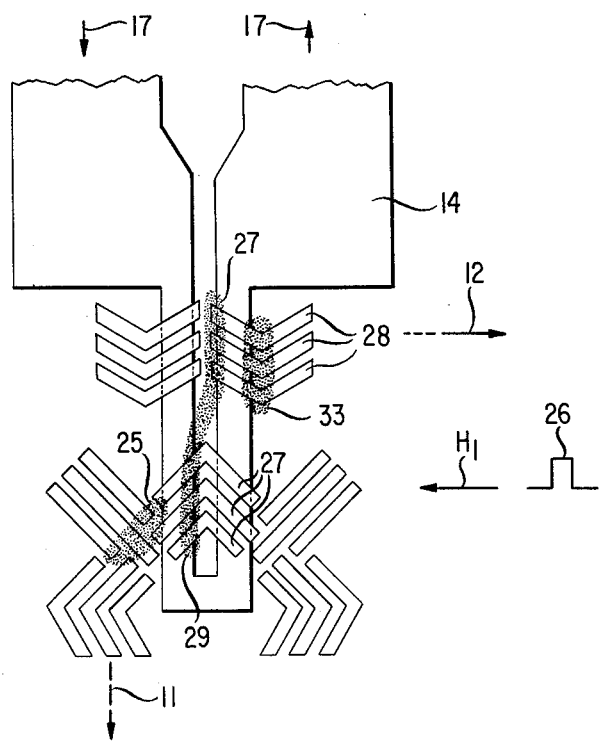

We will assume that a bubble 25 in a stream of bubbles (not shown) in loop 11 arrives at the exchange position as shown in FIG. 1. The drive field is directed to the left as viewed, and is indicated by the arrow designated $H_1$ in the figure. Control circuit 20 is operative on source 19 to maintain the drive field in this direction during a replicate operation. At this juncture in the operation, control circuit 20 also is operative on source 18 to apply a stretch pulse 26 as shown in FIG. 2. The stretch pulse, of a polarity indicated by arrows 17 for the assumed bubble magnetization direction and pattern relationship, is operative to generate positive poles in the area defined between the legs of conductor 14. The bubble, in response, stretches out to occupy the area between those legs. But the drive field in the direction $H_1$, indicated by the arrow so designated in FIG. 2, magnetizes elements 27 and 28 such that a bubble is drawn to the left ends thereof as viewed. As a consequence, the stretched bubble assumes a distorted shape 29 as shown in the figure and is astride the area between the legs of conductor 14. Pulse 26 is terminated under the control of circuit 20. Bubble 29 remains as shown due to the presence of drive field H in the fixed direction ($H_1$ in FIG. 2). Bubble 29 tends to move to the left edges of the conductor legs to positions determined by the poles in elements 27 and 28 of FIG. 3 when pulse 26 terminates.

Figure 3:
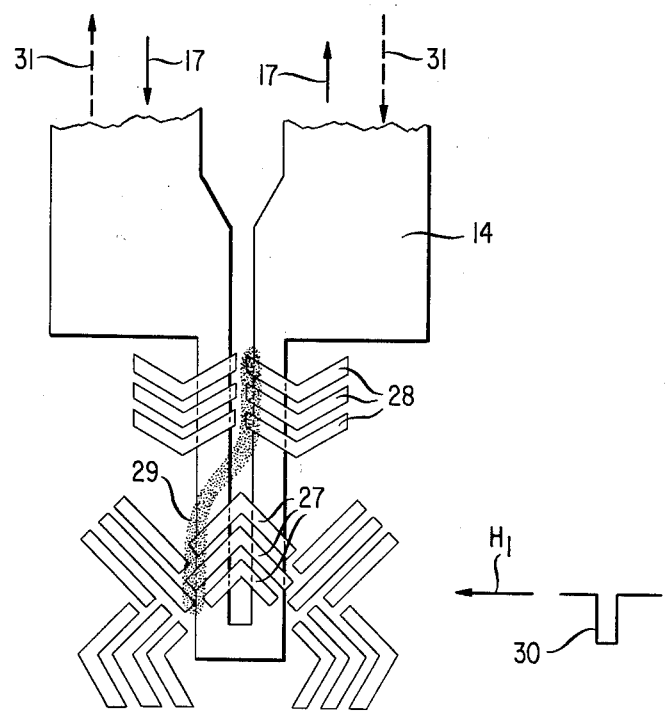

At an arbitrary later time, determined by overall memory system requirements, source 18 applies a cut pulse 30 to conductor 14 as indicated by waveform 30 in FIG. 3. The polarity of the cut pulse is opposite to that of the stretch pulse as indicated by waveform 30 and broken arrows 31 in the figure.

Figure 4:
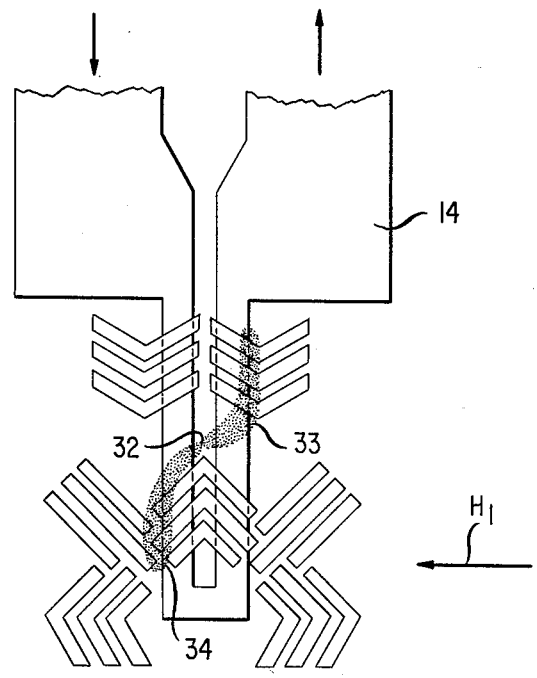

When pulse 30 is applied, the field between the legs of conductor 14 is antiparallel to the magnetization of the stretched bubble causing a break at point 32 in FIG. 4. The bubble is now split into two, designated 33 and 34 in FIG. 4. The two bubbles at the termination of cut pulse 30 occupy positions in different channels as shown in FIG. 1 for bubble 25 and bubble 33.

The propagation operation may continue at any arbitrary later time by the continued reorientation of the drive field to a downward (or to an upward) position indicated in FIG. 1 by arrow $H_2$. When the field so reorients, the bubbles 33 and 25 move to positions illustrated in FIG. 2, the bubbles moving left to right in channel 12 and counterclockwise in loop 11 as indicated by the broken arrows so designated in FIG. 2.

When the cut pulse (30) is applied, the outer edge of conductor 14 is driven positive. That is to say, a field parallel to the magnetization of the bubble is generated all along the outer edge of the conductor. Under such conditions, one might expect, say bubble 25 of FIG. 1 (or 34 of FIG. 4) to strip out along the edge of the conductor to form a strip attached to the chevron elements of both channel 12 and loop 11. Pulse 30 is of insufficient duration to allow such strip out to occur. In practice, such strip out is easily avoided while still permitting appreciable latitude in the duration of pulse 30. In practice, the phasing of the stretch and cut pulses with respect to the drive field was by far the most critical limitation in the operation of replicators operative in the presence of a reorienting drive field—the problem resolved by this invention.

In one specific embodiment of this invention, the circuit arrangement of FIG. 1 was defined by photolithographic techniques on the surface of a $Y_{2.75}Sm_{.2.5}Ga_{1.3}Fe_{3.7}O_{12}$ garnet film on a nonmagnetic substrate of $Gd_3Ga_5O_{12}$. The film exhibited bubbles having a diameter of 6 microns with a bias field of 90 Oersteds directed antiparallel to the magnetization of the domain and supplied by a circuit represented by block 40 of FIG. 1. The chevron elements were 4,000A thick with a 3.6-micron width by 27.2-micron length on 28-micron centers taken along the path of bubble movement. Conductor 14 was formed between the chevron pattern and the bubble film. The conductor was of Al(97)Ca(3) having a thickness of 4,000A and a width of 8 microns in the leg portion. The spacing between the legs was 6 microns. The stretch pulse 26 had a duration of 2.5 microseconds and an amplitude of 15 milliamperes. The cut pulse 30 similarly had a duration of 0.75 microseconds and an amplitude of -90 milliamperes. Operation was realized over a bias margin of 15 Oersteds. Operation was conducted with test circuits operative with a standard drive field of 32 Oersteds. Considerably different pulse duration and amplitudes as well as drive and bias field variations similarly led to wide operating margins.

The circuit of FIG. 1 was integrated into a major-minor memory configuration by the formation of a plurality of such circuits at exchange positions of the memory and the interconnection of the conductors (14) into a single conductor during formation. Successful operation over wide operating margins was achieved.

The realization of a bubble replicator of the field-access (permalloy pattern) type operative when the drive field is static is considered a considerable gain in the bubble field, permitting stop-start operation in which detection can occur in the absence of drive field reorientation as well as simultaneous replication. The benefits in signal-to-noise ratio and in logic-circuit complexity for controlling phasing is also significant.

The invention has been described in terms of controlling the orientation of the magnetic drive field to maintain a fixed orientation for the field during a replicate operation. The drive field is typically supplied by first and second coils driven in quadrature and disposed orthogonally with respect to one another. In one convenient arrangement, the plane of bubble movement is aligned with the first of the drive coils and the power to the second coil is terminated during replication. The power to the first coil is conveniently retained at a maximum during the replication operation. In an alternative arrangement, the drive field may be terminated altogether and a separate field of fixed orientation may be supplied separately.

What has been described is considered merely illustrative of the principles of this invention. Therefore, various modifications of the invention can be devised in accordance with those principles by those skilled in the art within the spirit and scope of the invention as encompassed by the following claims.

What is claimed is:

1. A magnetic arrangement comprising a layer of material in which single wall domains can be moved, a pattern of elements for defining first and second channels for domains in said layer, said channels being closely spaced at an exchange position therebetween, said elements being responsive to a magnetic field reorienting in the plane of said layer to move domains representative of information in said first and second channels, an electrical conductor coupled to said layer at said exchange position, means for applying to said conductor first and second pulses, and means for maintaining said reorienting magnetic field in a fixed orientation in said plane when said first and second pulses are applied for providing in said second channel an image of the information in said first channel.

2. An arrangement in accordance with claim 1 comprises a first channel including a plurality of stages and a plurality of second channels each closely spaced from an associated one of said stages at exchange positions therebetween, said second channels being adapted to recirculate single wall domains therein in response to said reorienting magnetic field, said electrical conductor being coupled to said layer at each of said exchange positions.

3. An arrangement in accordance with claim 2 wherein said pattern of elements comprises chevron shaped elements.

4. An arrangement in accordance with claim 3 wherein said elements are of permalloy.

5. An arrangement in accordance with claim 2 including means for providing a magnetic field reorienting in the plane of said layer wherein said means for providing a magnetic field in a fixed orientation comprises means for retaining said reorienting field in a fixed orientation.

* * * * *